United States Patent [19]

Timm et al.

[11] Patent Number: 5,673,228
[45] Date of Patent: Sep. 30, 1997

[54] INTEGRATED CIRCUIT HAVING AN EEPROM, SEMICONDUCTOR WAFER PROVIDED WITH SUCH INTEGRATED CIRCUITS, AND METHOD OF TESTING SUCH A SEMICONDUCTOR WAFER

[75] Inventors: Volker Timm, Pinneberg; Dirk Armbrust; Tom Holtz, both of Hamburg, all of Germany

[73] Assignee: U.S. Philips Corporation, New York, N.Y.

[21] Appl. No.: 423,248

[22] Filed: Apr. 13, 1995

[30] Foreign Application Priority Data

Apr. 16, 1994 [DE] Germany .................... 44 13 257.3

[51] Int. Cl.$^6$ ................................................ G11C 7/00
[52] U.S. Cl. .................... 365/201; 365/226; 371/21.1; 371/21.3
[58] Field of Search .................... 365/201, 226; 371/21.1, 21.3

[56] References Cited

U.S. PATENT DOCUMENTS 5,056,089  10/1991  Furuta et al. .................... 371/21.1
5,060,198  10/1991  Kowalski .................... 365/201
5,347,492   9/1994  Horiguchi et al. .................... 365/226

*Primary Examiner*—Son T. Dinh
*Attorney, Agent, or Firm*—Steven R. Biren

[57] ABSTRACT

Integrated circuits comprising an EEPROM require a large amount of time for testing, because the write time for a memory cell is very long. Notably the first test after manufacture, with the circuit still present on the wafer, is time consuming. The invention proposes a drastic reduction of the duration of the first test after manufacture by supplying a number of integrated circuits with a voltage in parallel and by providing each integrated circuit with an element whereby several block-wise write cycles for alternately "0" and "1" are executed in substantially autonomously and at the end of the first test step predetermined information is retained. This step is followed by a thermal treatment, after which the integrated circuits are individually contacted and first tested for information retention. For the parallel powering of the number of integrated circuits with an operation voltage during the first test step, supply terminals of the integrated circuits of this number are interconnected across the severing lanes on the wafer and one of the integrated circuits is contacted. When the individual integrated circuits are severed from one another, these conductor tracks are then automatically cut.

6 Claims, 2 Drawing Sheets

INTEGRATED CIRCUIT HAVING AN EEPROM, SEMICONDUCTOR WAFER PROVIDED WITH SUCH INTEGRATED CIRCUITS, AND METHOD OF TESTING SUCH A SEMICONDUCTOR WAFER

BACKGROUND OF THE INVENTION

The invention relates to an integrated circuit, comprising an EEPROM and a control circuit for controlling the reading and writing of information in the EEPROM, and also comprising voltage terminals for application of a supply voltage. The invention also relates to a semiconductor wafer with a plurality of integrated circuits formed thereon, which integrated circuits are arranged in rows and/or columns with intermediate lanes for severing the integrated circuits from one another, each integrated circuit comprising voltage terminals. The invention also relates to a method of testing the operation of all integrated circuits on the semiconductor wafer during which the integrated circuits are connected, after completion of manufacture, to a voltage in order to execute a first test step, after completion of which all memory locations contain the same, predetermined information, the semiconductor wafer subsequently being subjected to a thermal treatment in the no-voltage state, after which the integrated circuits are again connected to a voltage in order to execute a second test step during which the contents of the memory locations are read and tested.

Integrated circuits comprising an EEPROM and a control circuit are generally known. Integrated circuits of this kind are provided, for example in the so-called telephone cards which enable the use of appropriately equipped public telephones. Further applications of such integrated circuits can be found, for example in credit cards for executing banking transactions. Furthermore, such integrated circuits may also comprise a control circuit in the form of a microprocessor, the EEPROM then forming part of the overall memory of the microprocessor.

After manufacture the integrated circuits must always be tested for correct operation before they can be processed further. This also includes the testing of the memory included in the integrated circuit, notably the testing as to whether all memory cells can be properly addressed, read and written, if applicable. In the case of integrated circuits comprising an EEPROM, a difficulty is encountered in that the writing of information in such memories is rather time-consuming. Consequently, the testing of such integrated circuits is also very time-consuming. Moreover, in order to test whether the memory cells in an EEPROM permanently retain their information, the first test is executed in two steps with an intermediate thermal treatment. This means that every integrated circuit must twice be completely contacted through all terminals so as to be connected to a test apparatus.

SUMMARY OF THE INVENTION

It is an object of the invention to provide an integrated circuit of the kind set forth with an EEPROM which can be tested in a simpler and less time-consuming manner.

This object is achieved in accordance with the invention in that the control circuit comprises a test circuit which writes alternately the binary information "0" and "1", preferably a number of times, into all memory cells of the EEPROM in a highly independent manner when a voltage is applied to at least some voltage terminals for the first time. Such a circuit may have a simple construction and comprises essentially a simple sequencer which alternately supplies the memory with the information "1" and "0" and which preferably writes this information in parallel into all memory cells of the EEPROM by adjusting the address decoder for parallel driving of the column and row leads. The sequencer can operate completely independently, for example by means of a counter and an oscillator which are customarily included in the control circuit for normal operation, or via an externally applied control clock.

The test circuit and hence the first test step can be activated in various ways. One possibility consists in applying a control signal, notably the control clock, via a further terminal, thus controlling the writing of the information. A further possibility consists in providing an additional voltage terminal, the test circuit then being automatically activated when a supply voltage is applied via this additional voltage terminal.

Consequently, the integrated circuit need only be connected to the supply voltage in order to execute the first test step. This means that this first test step can be simultaneously performed for a plurality of integrated circuits in parallel when these integrated circuits are simultaneously connected to a voltage source by appropriate contact elements; moreover, this first test step does not require a complex test arrangement either.

The integrated circuits, or the cards provided with such circuits, are often intended for applications where modification of the memory contents other than for normal use must absolutely be precluded. For example, in the case of telephone cards erasure of the memory contents must be prevented as otherwise the card can be abusively used again. Therefore, an embodiment of the invention is characterized in that the test circuit can be permanently deactivated for the entire service life of the integrated circuit. This is because once a test has been carried out in the described manner, after manufacture of the integrated circuit, such a test will never be carried out again with a card provided with this integrated circuit. Deactivation can be performed, for example by melting a fuse in the integrated circuit by application of a current surge or by writing given information in a single, predetermined memory cell of the EEPROM or a separate memory cell after the test, so that testing at a later stage is prevented. Another possibility consists, for example in feeding out a conductor track required for the activation of the test circuit from the integrated circuit so that it extends across an area of the semiconductor wafer in which the severing lane for severing the simultaneously manufactured integrated circuits is located. This possibility offers the advantage that the test step can be repeated for as long as the integrated circuits on the semiconductor wafer have not been severed.

During the manufacture of integrated circuits it may occur that, for example due to fault, the conductor tracks for the supply voltage contain a short-circuit within the integrated circuit. When a plurality of integrated circuits are simultaneously powered, the first test step could not be executed for the other integrated circuits should one of these circuits contain a voltage short-circuit. Therefore, in an embodiment of the invention there is provided a current limiting circuit which is connected directly to one of the voltage terminals, all further elements of the integrated circuit being connected to the one voltage terminal exclusively via the current limiting circuit. In that case a faulty integrated circuit would derive only a limited current from the supply voltage, so that further, simultaneously tested integrated circuits can be powered in parallel by the same supply voltage source.

The control of the test circuit, or of the sequencer provided therein, by means of control clock pulses can take place via the supply voltage source even in the absence of an additional terminal, notably if a separate terminal is used for at least one pole of the supply voltage during the first test step. To this end, the supply voltage is periodically switched between a voltage value which suffices for the operation of the control circuit and a higher supply voltage which corresponds to the programming voltage of the EEPROM. Each time when the supply voltage assumes the programming voltage value, information is written into all memory cells in parallel, the value thereof being switched over after each return of the supply voltage to the normal value. In order to prevent the elements of the control circuit from being damaged by the switching over to the programming voltage value, in a further embodiment of the invention there is provided a voltage control circuit which is coupled to one of the voltage terminals in order to generate an essentially constant output voltage in the case of input voltages within a predetermined range of values, which output voltage serves to power at least a part of the elements of the integrated circuit. As a result, the first test step can be particularly simply controlled.

The simultaneous testing of a plurality of integrated circuits is based on the fact that integrated circuits are manufactured in large numbers on a single semiconductor wafer. The first test of the integrated circuit is then executed after the last manufacturing step while the circuits are still present on the semiconductor wafer, i.e. before they are severed. Therefore, the invention also relates to a semiconductor wafer of the kind set forth, comprising a plurality of integrated circuits in accordance with the invention, the additional object being the execution of the testing of the integrated circuits on the semiconductor wafer in a particularly simple manner. This object is achieved in accordance with the invention in that at least the voltage terminals of at least a number of neighbouring integrated circuits are interconnected via conductor tracks which extend across the severing lanes provided on the semiconductor wafer. Thus, it is particularly simple to supply a plurality of integrated circuits on the semiconductor wafer simultaneously with a voltage, and hence to execute the first test step simultaneously for these integrated circuits.

The invention also relates to said method of testing the operation of integrated circuits in accordance with the invention on the semiconductor wafer, said testing thus being performed in two steps with an intermediate thermal treatment. In order to enable the first test step to be executed as quickly as possible and by means of a very simple device, the method in accordance with the invention is characterized in that during the first test step exclusively the conductor tracks via which the voltage terminals of at least a number of neighbouring integrated circuits are interconnected are connected to a voltage so as to initiate the automatic, alternating writing of the binary information "0" and "1" into all memory locations of the EEPROM by the control circuit, and that all further write, read and erase tests, preferably commencing with a read test, are executed only during the second test step subsequent to the thermal treatment. Thus, during the first test step each time only a number of integrated circuits receive an operating voltage and simple control signals whereby subsequently a defined information state is adjusted in the EEPROM of each integrated circuit, without this state being tested. Thus, contacting of the other contacting pads of each integrated circuit is dispensed with, and the first test step is thus executed in a time-saving manner. Faulty integrated circuits where, for example, already the writing of modified data into the EEPROM is not possible, are then detected only during the second test step; however, this is not a drawback because the testing of such faulty integrated circuits during the first test step did not require any additional time.

BRIEF DESCRIPTION OF THE DRAWING

Embodiments of the invention will be described in detail hereinafter with reference to the drawing, in which.

DESCRIPTION OF THE PREFERRED EMBODIMENTS

Figure 1:
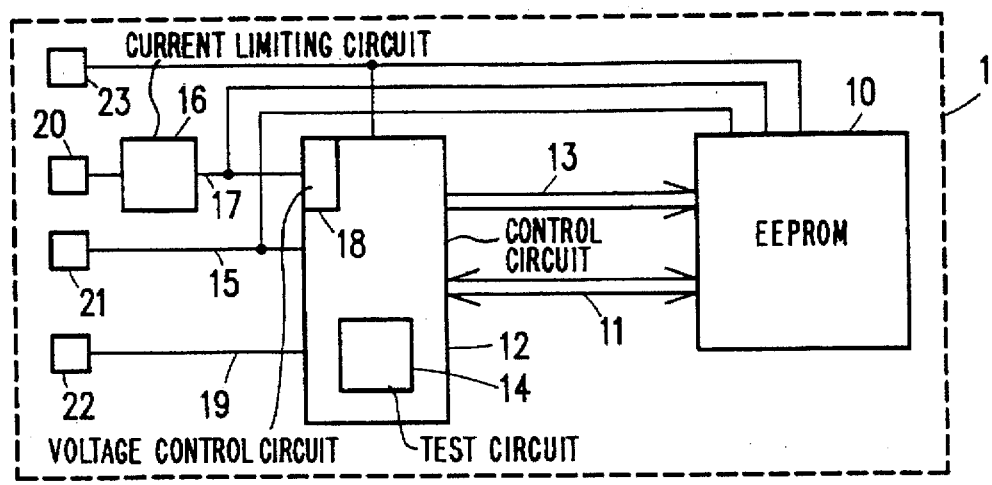
FIG. 1 shows a block diagram of an integrated circuit.

Referring to FIG. 1, a single integrated circuit 1 comprises an EEPROM 10 which is driven by a control circuit 12, via address leads 13 and data leads 11. The control circuit 12 can be constructed in various, generally known ways. The EEPROM 10 and the control circuit 12 in the present embodiment receive a voltage via two leads 15 and 17, the lead 15 being connected directly to a voltage terminal 21 whereas the lead 17 is connected to a voltage terminal 20 via a current limiting circuit 16. The voltage terminal 20 is in this case used exclusively for the execution of the test; during normal operation, the control circuit 12 and the memory 10 receive an operating voltage via a voltage terminal 23 as well as the common terminal 21. At the input of the control circuit 12 the lead 17 is connected to a diagrammatically represented voltage control circuit 18 which generates a constant operating voltage for the control circuit 12 and derives a control clock signal for controlling the writing of alternating information from variations of the voltage on the lead 17. Furthermore, via a lead 19 the control circuit 12 is connected to a signal terminal 22; however, it will be evident that a larger number of signal leads 19 with a correspondingly larger number of signal terminals may also be involved.

The control circuit 12 comprises a diagrammatically shown test circuit 14 which, upon application of a supply voltage to the terminals 20 and 21, automatically addresses all addresses of the EEPROM 10, for example in parallel, and alternately writes the information "1" and "0" a number of times into each addressed memory location. Finally, the information is written at a voltage at which the floating gate, forming part of each storage cell of the EEPROM, is charged.

Figure 2:
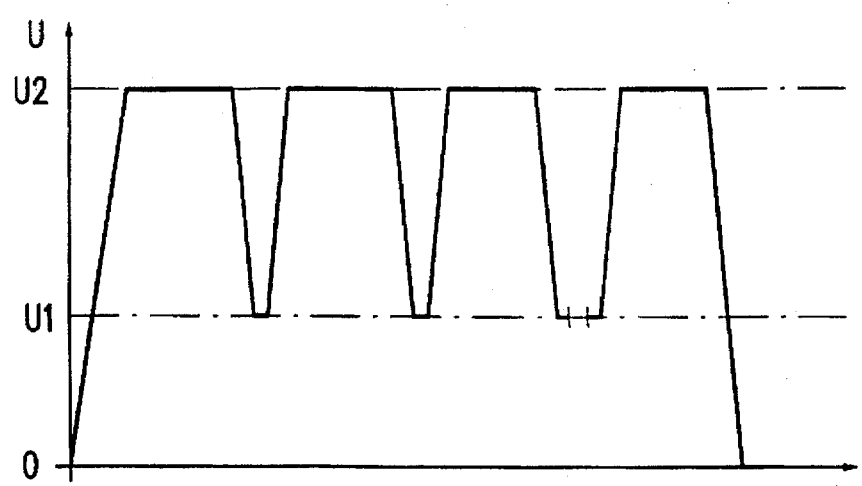
FIG. 2 shows the variation of the supply voltage during the first test step.

The alternating writing of the information "1" and "0" is controlled via the applied voltage which varies as shown in FIG. 2. The voltage first increases to a high value U2, the control circuit 12 initially being set to a defined initial state in a customary manner; after the value U2, corresponding to the programming voltage of the EEPROM 10, has been reached, information which is defined by said initial state is written. To this end, the supply voltage U retains the value U2 for a sufficient period of time, after which it decreases to the value U1 which corresponds approximately to the normal operating voltage of the control circuit 12. The information subsequently applied to the memory 10 is thus changed to the opposite binary value. The supply voltage U subsequently increases again to the value U2 whereby the adjusted information is written. This changing over of the supply voltage U between the values U1 and U2 takes place a number of times in order to subject the storage cells to a stress enabling the detection of faulty storage cells. A test whether the information has been correctly written, i.e. a read test, is not performed during this test step; it is performed only during a next test step as will be explained hereinafter.

The current limiting circuit 16 is of a customary construction; in the simplest case it is constructed as a series resistor. Should a short-circuit occur between the leads 15 and 17 due to a defect in the integrated circuit 1, or should an inadmissible low-ohmic connection occur in the control circuit or the EEPROM, a current is derived from the voltage terminal 20 which is not larger than the current predefined by the current limiting circuit 16. Therefore, in the case of faulty integrated circuits it is still simply possible to power a number of integrated circuits in parallel by means of the same supply voltage.

Figure 3:
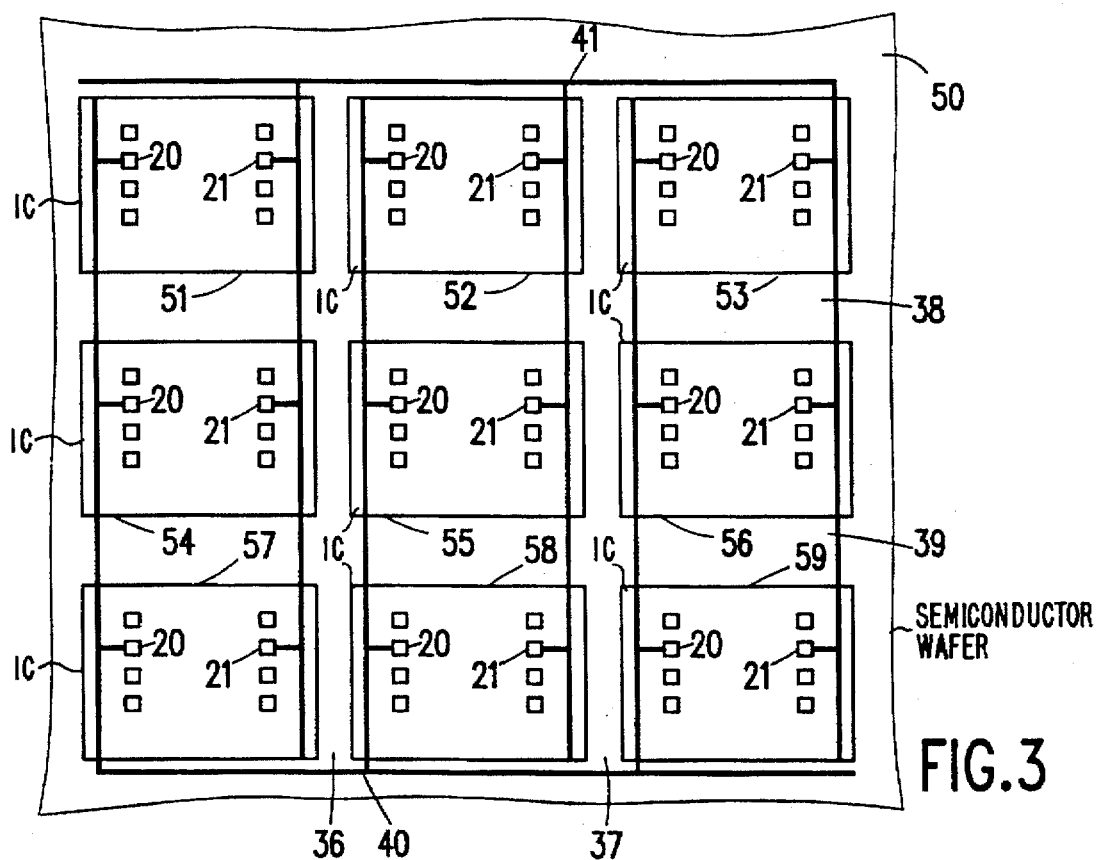
FIG. 3 shows the arrangement of a plurality of integrated circuits on a semiconductor wafer.

This is the case in the arrangement shown in FIG. 3 which depicts a part of a semiconductor wafer 50 comprising a plurality of integrated circuits, only a number or group of integrated circuits 51 to 59 being indicated. These integrated circuits are arranged, like the further circuits which are not shown, in a regular array of rows and columns. Between the columns of integrated circuits there are provided lanes 36 and 37 and between the rows of circuits there are provided lanes 38 and 39, after the testing of the integrated circuits cuts being made along said lanes in order to severe the individual integrated circuits from one another.

Each integrated circuit 51 to 59 comprises contact pads, only the voltage terminals 20 and 21, corresponding to FIG. 1, being indicated. The voltage terminals 20 of all integrated circuits of the group are connected to a conductor track 40 which crosses the lanes 38 and 39 in each column, extends along the severing lane (not indicated) at the lower side of the integrated circuits 57 to 59, and interconnects all three perpendicular conductor track segments. Similarly, the voltage terminals 21 of all integrated circuits of the group are connected to a conductor track 41 which also crosses the lanes 38 and 39 and interconnects the perpendicular conductor track segments at the upper side of the integrated circuits 51 to 53.

As long as the semiconductor wafer 50 has not been subdivided, it suffices to contact the terminals 20 and 21 of only one integrated circuit of each group and to apply voltage via these terminals. All integrated circuits of this groups thus receive an operating voltage. When the applied voltage consists of a combination of a supply voltage and control signals, as has been described with reference to FIG. 2, the information "0" and "1" is alternately written simultaneously into the EEPROM of all integrated circuits. Thus, this requires only the contacting of two terminals of this group and, moreover, only a simple testing device supplying the combination of supply voltage and control signals is required.

Figure 4:
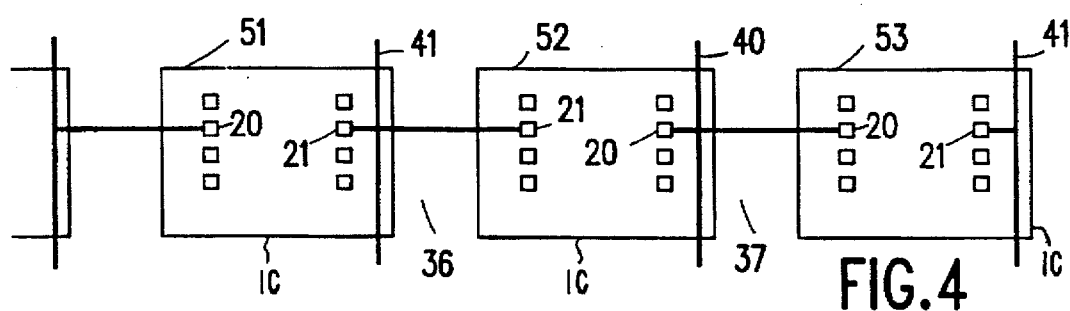
FIG. 4 shows a further possibility for connecting the voltage supply terminals of several integrated circuits on the semiconductor wafer.

The number of integrated circuits which can be supplied with the operating voltage in common via a respective conductor pair is dependent essentially on the current consumption of the individual integrated circuits in the normal operating condition, as well as on the width of the conductor tracks. Notably in the case of a low power consumption of the individual integrated circuits it is also possible to use the connection possibility indicated in FIG. 4. Therein, the integrated circuit 51 is provided on the semiconductor wafer so as to be mirrored about the vertical axis relative to the integrated circuit 52, so that the voltage supply terminals face one another; this also holds for the other integrated circuits in the individual columns of the group. The voltage terminals 20 and 21 of each time two columns of integrated circuits are then connected to the same conductor tracks 40 and 41. As a result, only one conductor track 40 or 41 need be provided between columns of integrated circuits.

Figure 5:
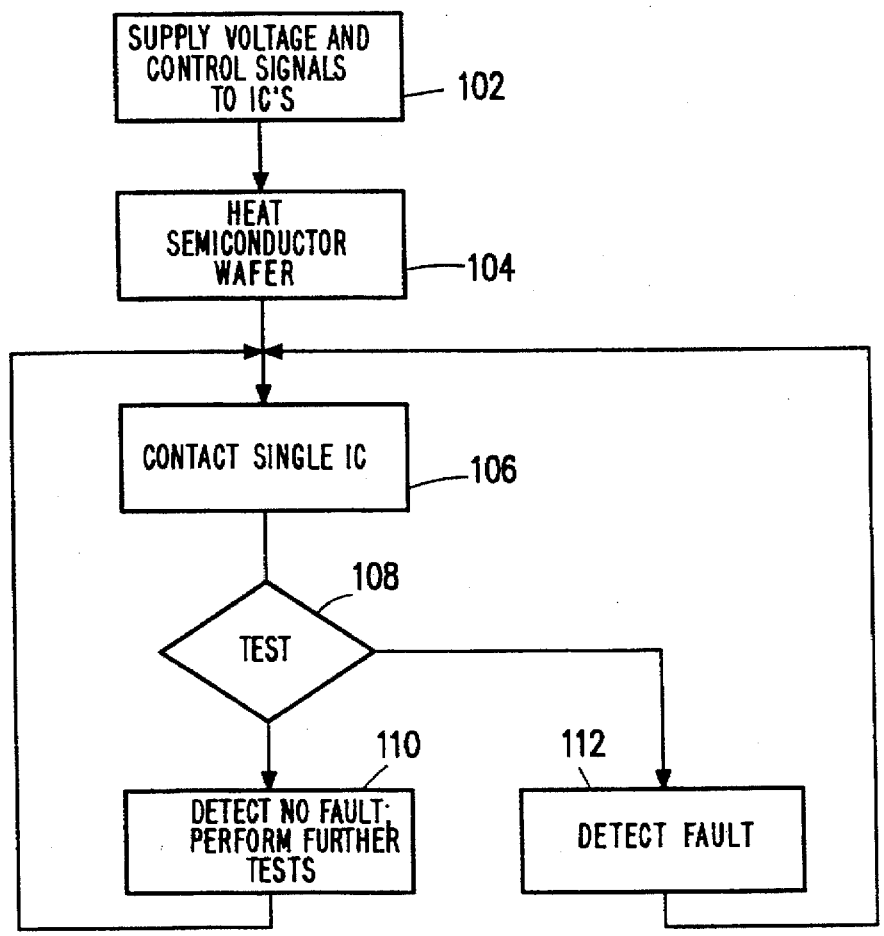
FIG. 5 shows a flow chart illustrating the execution of the test.

The testing of the integrated circuits on the semiconductor wafer 50 is then executed in conformity with the flow chart shown in FIG. 5. In block 102 the groups of integrated circuits are successively supplied with a voltage and (possibly combined) control signals, so that ultimately the same information is stored in all integrated circuits on the semiconductor wafer, provided that they are not faulty. In conformity with block 104, the semiconductor wafer is then heated to a predetermined high temperature for a predetermined period of time.

In conformity with block 106, only a single integrated circuit is then contacted; however, in this case the voltage terminals 21 and 23 as well as the signal terminal 22 as well as possibly further signal terminals in FIG. 1. Because the control circuit 12 then no longer receives a voltage via the voltage terminal 20, the test circuit 14 is also automatically deactivated and the integrated circuit can be tested as regards all relevant functions via the signal terminals. Notably the contents of the EEPROM in the contacted integrated circuit are first read one address after the other. For each address it is tested, in conformity with block 108, whether the information read corresponds to the predetermined information. As soon as this is not the case, the relevant integrated circuit is marked, in conformity with block 112, as being faulty and the test proceeds to the block 106 for the next integrated circuit. As a result, an integrated circuit in which the retention of charge and hence the retention of information does not function for a prolonged period of time can be very quickly excluded from further testing, so that testing overall is accelerated.

When the testing of an integrated circuit in conformity with block 108 reveals that all information read is correct, the further test operations are performed in block 110, for example, the individual storage cells of the EEPROM are erased or overwritten with other information, the written information again being tested. The control circuit itself can then be tested in a customary manner. After completion of the testing of an integrated circuit, a return is always made to the block 106 in which the next integrated circuit is first tested for charge retention and hence information retention.

For the testing of a semiconductor wafer comprising a large number of integrated circuits with an EEPROM this method enables a drastic reduction of the time required for the first test step, preceding the thermal treatment, and at the same time allows for the use of a significantly simpler testing device.

We claim:

1. An integrated circuit, comprising an EEPROM and a control circuit for controlling the reading and writing of information in the EEPROM, and voltage terminals for application of a supply voltage, characterized in that the control circuit (12) comprises a test circuit (14) which alternately and repetitively writes binary information "0" and "1" into all memory cells of the EEPROM (10) in a highly automatic manner only when a voltage is applied to selected voltage terminals (20, 21) of the integrated circuit for the first time.

2. An integrated circuit as claimed in claim 1, characterized in that after the test circuit (10) alternately and repetitively writes said binary information into all memory cells of the EEPROM, the test circuit is permanently deactivated for the entire service life of the integrated circuit.

3. An integrated circuit as claimed in claim 1 characterized in that there is provided a current limiting circuit (16) which is connected directly to one of the voltage terminals (20), all further elements (10, 12, 14) of the integrated circuit (1) being connected to the one voltage terminal (20) exclusively via the current limiting (16).

4. An integrated circuit as claimed in claim 1, characterized in that there is provided a voltage control circuit (18) which is coupled to one of the voltage terminals (20) in order to generate an essentially constant output voltage in the case of input voltages within a predetermined range of values, which output voltage serves to power at least a part of the elements (10, 12, 14) of the integrated circuit (1).

5. A semiconductor wafer with a plurality of integrated circuits formed thereon as claimed in claim 1, which integrated circuits are arranged in rows and/or columns with intermediate lanes for severing the integrated circuits from one another, each integrated circuit comprising voltage terminals, characterized in that at least the voltage terminals (20, 21) of at least a number of neighbouring integrated circuits (51 to 59) are interconnected via conductor tracks (40, 41) which extend across the severing lanes (36 to 39) provided on the semiconductor wafer (50).

6. A method of testing the operation of all integrated circuits on a semiconductor wafer as claimed in claim 5, during which the integrated circuits are connected, after completion of manufacture, to a voltage in order to execute a first test step, after completion of which all memory locations contain the same predetermined information, the semiconductor wafer subsequently being subjected to a thermal treatment in the no-voltage state, after which the integrated circuits are again connected to a voltage in order to execute a second test step during which the contents of the memory locations are read and tested, characterized in that the conductor tracks via which the voltage terminals of at least a number of neighbouring integrated circuits are interconnected are connected to a voltage so as to initiate the automatic, alternating writing of the binary information "0" and "1" into all memory locations of the EEPROM by the control circuit only during the first test step, and that all further write, read and erase tests, are executed only during the second test step subsequent to the thermal treatment.

* * * * *